US011588136B2

United States Patent
Chen et al.

(10) Patent No.: US 11,588,136 B2
(45) Date of Patent: Feb. 21, 2023

(54) ORGANIC LIGHT-EMITTING DIODE WITH SCATTERING LAYER OF ALUMINUM-COBALT-COPPER NANO-QUASICRYSTAL AND MANUFACTURING METHOD THEREOF

(71) Applicant: NATIONAL TSING HUA UNIVERSITY, Hsinchu (TW)

(72) Inventors: Sinn-Wen Chen, Hsinchu (TW); Anbalagan Ramakrishnan, Hsinchu (TW); Sudam Chavhan, Hsinchu (TW); Kiran Kishore Kesavan, Hsinchu (TW); Mangey Ram Nagar, Hsinchu (TW); Jwo-Huei Jou, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 73 days.

(21) Appl. No.: 17/210,200

(22) Filed: Mar. 23, 2021

(65) Prior Publication Data
US 2022/0173357 A1   Jun. 2, 2022

(30) Foreign Application Priority Data
Nov. 30, 2020   (TW) .................................. 109142114

(51) Int. Cl.
*H01L 51/56* (2006.01)
*H01L 51/52* (2006.01)

(52) U.S. Cl.
CPC .......... *H01L 51/5268* (2013.01); *H01L 51/56* (2013.01)

(58) Field of Classification Search
CPC ....................................................... H01L 51/56
See application file for complete search history.

(56) References Cited

U.S. PATENT DOCUMENTS

| | | | | |
|---|---|---|---|---|
| 8,232,572 B2* | 7/2012 | Fukuda | ................. | H05B 33/10 257/98 |
| 8,283,853 B2* | 10/2012 | Yan | .................... | H01L 51/5268 445/24 |
| 8,304,788 B2* | 11/2012 | Fukuda | ............... | H01L 51/5271 313/506 |

(Continued)

FOREIGN PATENT DOCUMENTS

TW   201240112 A   10/2012

OTHER PUBLICATIONS

Ramakrishnan, Anbalagan, et al. "Liquid Exfoliation of Decagonal Quasicrystals and its Light Out-Coupling Performance in Organic Light-Emitting Devices" Advanced Photonics Research, (2020), vol. 1, No. 2: 2000042.

*Primary Examiner* — Caleb E Henry
(74) *Attorney, Agent, or Firm* — McBee Moore & Vanik IP, LLC; Susan McBee; David Vanik

(57) ABSTRACT

A manufacturing method of an organic light-emitting diode is provided in the present disclosure. The manufacturing method of the organic light-emitting diode includes steps as follows. A substrate is provided and a layered structure forming step is performed. In the layered structure forming step, an anode layer, a scattering layer, an emissive layer and a cathode layer are sequentially formed on the substrate, so as to obtain an organic light-emitting diode. A material of the scattering layer is a quasicrystalline material.

17 Claims, 11 Drawing Sheets

(56) References Cited

U.S. PATENT DOCUMENTS

| | | | | |
|---|---|---|---|---|
| 8,304,796 B2* | 11/2012 | Fukuda | ............... | H01L 51/5265 359/569 |
| 8,389,980 B2* | 3/2013 | Sumioka | ............ | H01L 51/5271 257/89 |
| 2008/0303419 A1* | 12/2008 | Fukuda | ............... | H01L 27/3246 313/506 |
| 2010/0187987 A1* | 7/2010 | Nakamura | .......... | H01L 51/5268 313/504 |
| 2010/0219427 A1* | 9/2010 | Fukuda | ............... | H01L 51/5268 257/89 |
| 2011/0006313 A1* | 1/2011 | Sumioka | ............ | H01L 51/5271 257/E33.072 |
| 2011/0101386 A1* | 5/2011 | Fukuda | ............... | H01L 51/5271 257/89 |
| 2011/0193116 A1* | 8/2011 | Fukuda | ................ | H05B 33/10 257/E33.068 |
| 2011/0213094 A1* | 9/2011 | Fechner | ................ | C09D 5/027 525/344 |
| 2016/0204167 A1* | 7/2016 | Jun | ..................... | H01L 51/5228 257/72 |
| 2017/0003423 A1* | 1/2017 | Jiang | ................... | G02F 1/133514 |
| 2018/0210280 A1* | 7/2018 | Chen | ..................... | H01L 27/016 |
| 2018/0269260 A1* | 9/2018 | Ghosh | ................... | H01L 27/3211 |
| 2020/0027928 A1* | 1/2020 | Wu | ........................ | H01L 27/322 |
| 2020/0035755 A1* | 1/2020 | Zhou | ...................... | G06F 3/011 |
| 2020/0091251 A1* | 3/2020 | Hu | ........................ | H01L 27/3246 |
| 2020/0103709 A1* | 4/2020 | Madigan | ........... | G02F 1/133504 |
| 2020/0152704 A1* | 5/2020 | Jang | ........................ | H01L 51/56 |
| 2020/0161585 A1* | 5/2020 | Palles-Dimmock | ........................ H01L 51/0037 | |
| 2020/0212119 A1* | 7/2020 | Shim | .................... | H01L 27/3209 |
| 2020/0218084 A1* | 7/2020 | Zhu | ...................... | G02B 26/005 |
| 2020/0227484 A1* | 7/2020 | Lin | ...................... | H01L 51/5284 |
| 2020/0343315 A1* | 10/2020 | Lin | ...................... | H01L 27/322 |
| 2021/0074770 A1* | 3/2021 | Choe | ................... | G02B 5/0278 |

* cited by examiner

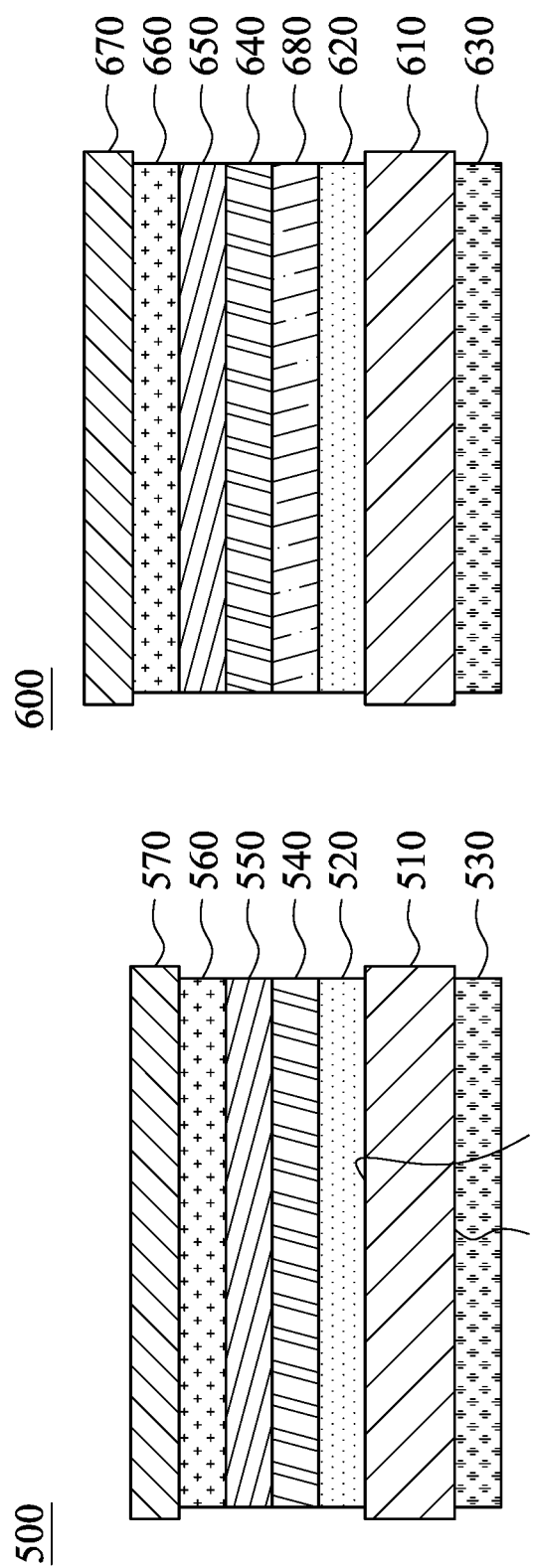

ORGANIC LIGHT-EMITTING DIODE WITH SCATTERING LAYER OF ALUMINUM-COBALT-COPPER NANO-QUASICRYSTAL AND MANUFACTURING METHOD THEREOF

RELATED APPLICATIONS

This application claims priority to Taiwan Application Serial Number 109142114, filed Nov. 30, 2020, which is herein incorporated by reference.

BACKGROUND

Technical Field

The present disclosure relates to an organic light-emitting diode. More particularly, the present disclosure relates to an organic light-emitting diode including a quasicrystalline material.

Description of Related Art

The organic light-emitting diode (OLED) is one type of light-emitting diodes which has an electroluminescence layer made from organic materials. Compare the organic light-emitting diode to the conventional liquid-crystal display, the organic light-emitting diode has advantages, such as low cost, simple manufacturing process, high contrast, wide view angle, short response time, high flexibility and energy efficiency, due to the difference in materials. Thus, it makes the organic light-emitting diode become a light-emitting element with great potential.

However, the light extraction efficiency of the organic light-emitting diode is still poor because the refractive indices of the electrode layers and the glass substrate in the organic light-emitting diode and the refractive index of the atmosphere are different from one another. In order to remedy this defect, a lot of methods, such as Bragg grating, low-index grid or substrate with nano structural surface have been developed to enhance the light extraction efficiency. Nevertheless, the costs of the aforementioned methods are pretty high, and the manufacturing processes thereof are complicated for large-scale production.

In this regard, how to improve the luminescence properties of the organic light-emitting diode through simple manufacturing process has become a pursuit target for vendors.

SUMMARY

According to one embodiment of one aspect in the present disclosure, a manufacturing method of an organic light-emitting diode includes steps as follows. A substrate is provided and a layered structure forming step is performed. In the layered structure forming step, an anode layer, a scattering layer, an emissive layer and a cathode layer are sequentially formed on the substrate, so as to obtain an organic light-emitting diode. A material of the scattering layer is a quasicrystalline material.

According to one embodiment of another aspect in the present disclosure, an organic light-emitting diode is provided. The organic light-emitting diode is manufactured by the aforementioned manufacturing method of the organic light-emitting diode.

According to another embodiment of one aspect in the present disclosure, a manufacturing method of an organic light-emitting diode includes steps as follows. A substrate is provided, a scattering layer forming step is performed and a layered structure forming step is performed. The substrate includes an upper surface and a bottom surface opposite to the upper surface. In the scattering layer forming step, a scattering layer is formed on the bottom surface of the substrate. In the layered structure forming step, an anode layer, an emissive layer and a cathode layer are sequentially formed on the upper surface of the substrate, so as to obtain an organic light-emitting diode. A material of the scattering layer is a quasicrystalline material.

According to another embodiment of another aspect in the present disclosure, an organic light-emitting diode is provided. The organic light-emitting diode is manufactured by the aforementioned manufacturing method of the organic light-emitting diode.

BRIEF DESCRIPTION OF THE DRAWINGS

The present disclosure can be more fully understood by reading the following detailed description of the embodiment, with reference made to the accompanying drawings as follows:

FIG. 5 is a structural schematic view of another organic light-emitting diode manufactured by the manufacturing method of the organic light-emitting diode of FIG. 4.

FIG. 6 is a structural schematic view of one another organic light-emitting diode manufactured by the manufacturing method of the organic light-emitting diode of FIG. 4.

DETAILED DESCRIPTION

Figure 1:
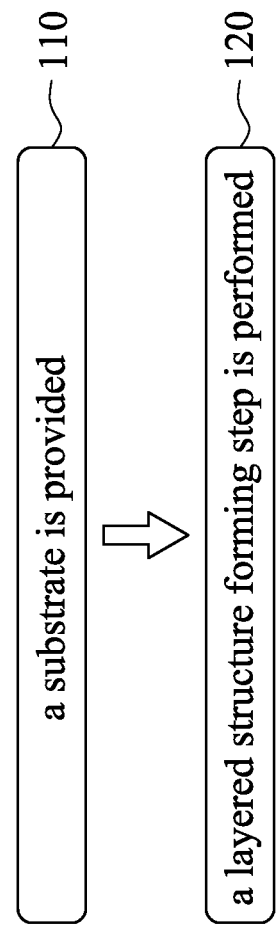
FIG. 1 is a flow chart of a manufacturing method of an organic light-emitting diode according to one embodiment of the present disclosure.
Figure 2:
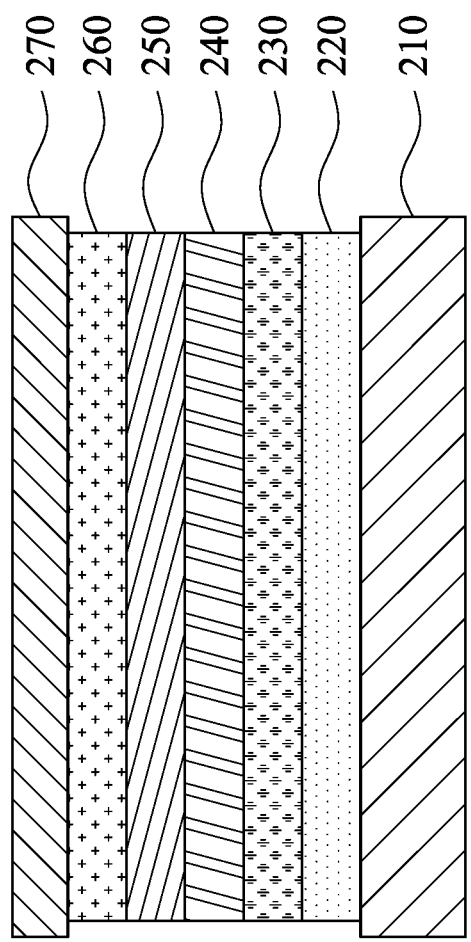
FIG. 2 is a structural schematic view of one organic light-emitting diode manufactured by the manufacturing method of the organic light-emitting diode of FIG. 1.

Please refer to FIG. 1 and FIG. 2. FIG. 1 is a flow chart of a manufacturing method of an organic light-emitting diode 100 according to one embodiment of the present disclosure. FIG. 2 is a structural schematic view of one organic light-emitting diode 200 manufactured by the manufacturing method of the organic light-emitting diode 100 of FIG. 1. The manufacturing method of the organic light-emitting diode 100 includes Step 110 and Step 120.

In Step 110, a substrate 210 is provided. A material of the substrate 210 can be a transparent material with high transmittance, such as glass, polyimide (PI) or polyethylene naphthalate (PEN).

In Step 120, a layered structure forming step is performed to sequentially form an anode layer 220, a scattering layer 230, an emissive layer 250 and a cathode layer 270 on the substrate 210, so as to obtain the organic light-emitting diode 200. Furthermore, a hole transport layer 240 can be formed between the scattering layer 230 and the emissive layer 250, or an electron transport layer 260 can be formed between the emissive layer 250 and the cathode layer 270. The hole transport layer 240 and the electron transport layer 260 are configured to improve the transport of holes and electrons. Thus, the hole transport layer 240 and the electron transport layer 260 can be arranged according to the transport properties of the materials of other layers.

Figure 3:
FIG. 3 is a flow chart of a synthesis method for manufacturing an aluminum-cobalt-copper nano-quasicrystal used in the manufacturing method of the organic light-emitting diode of FIG. 1.

Please note that the scattering layer 230 can be spin-coated on the anode layer 220 to obtain better coating results. A material of the scattering layer 230 is a quasicrystalline material, and the quasicrystalline material can be an aluminum-cobalt-copper nano-quasicrystal. Please refer to FIG. 3. FIG. 3 is a flow chart of a synthesis method 300 for manufacturing the aluminum-cobalt-copper nano-quasicrystal used in the manufacturing method of the organic light-emitting diode 100 of FIG. 1. The synthesis method 300 includes Step 310, Step 320 and Step 330.

In detail, a raw material is provided in Step 310. The raw material includes an aluminum metal, a cobalt metal and a copper metal.

In Step 320, an annealing step is performed to anneal the raw material after the raw material is melted, so as to obtain an aluminum-cobalt-copper quasicrystal. The raw material, which is melted, can be annealed under 900° C. in the vacuum for 15 days.

In Step 330, an exfoliating step is performed. The aluminum-cobalt-copper quasicrystal is mixed with a solvent to form a quasicrystalline solution. The quasicrystalline solution is sonicated, so as to make the aluminum-cobalt-copper quasicrystal exfoliate into the aluminum-cobalt-copper nano-quasicrystal. The solvent can be an N,N-dimethylformamide solvent, and the quasicrystalline solution can be sonicated for 60 hours.

Figure 4:
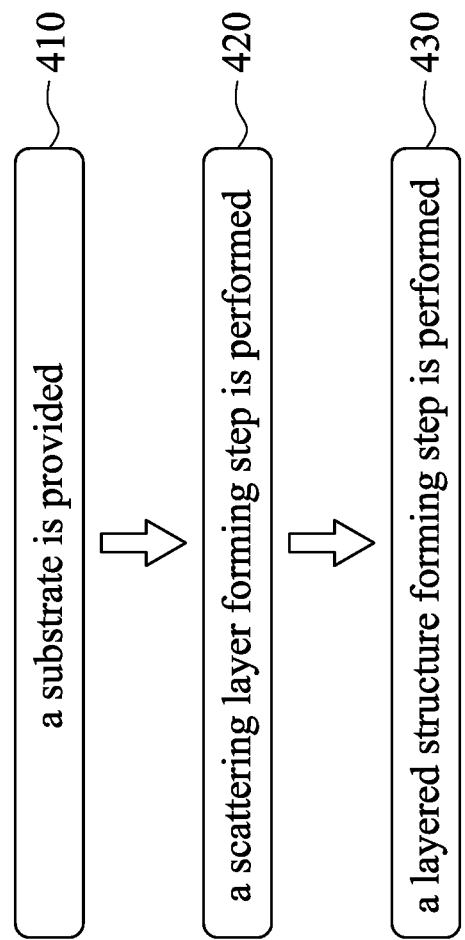
FIG. 4 is a flow chart of a manufacturing method of an organic light-emitting diode according to another embodiment of the present disclosure.

Please refer to FIG. 4 and FIG. 5. FIG. 4 is a flow chart of a manufacturing method of an organic light-emitting diode 400 according to another embodiment of the present disclosure. FIG. 5 is a structural schematic view of another organic light-emitting diode 500 manufactured by the manufacturing method of the organic light-emitting diode 400 of FIG. 4. The manufacturing method of the organic light-emitting diode 400 includes Step 410, Step 420 and Step 430.

In Step 410, a substrate 510 is provided. A material of the substrate 510 can be the aforementioned materials, and the substrate 510 includes an upper surface 511 and a bottom surface 512 opposite to the upper surface 511.

In Step 420, a scattering layer forming step is performed to form a scattering layer 530 on the bottom surface 512 of the substrate 510. The scattering layer 530 can be drop-cast on the bottom surface 512 of the substrate 510 to obtain better coating results. Similarly, a material of the scattering layer 530 is a quasicrystalline material, which can be an aluminum-cobalt-copper nano-quasicrystal. The synthesis method for manufacturing the aluminum-cobalt-copper nano-quasicrystal has been introduced above, and the details will not be given herein.

In Step 430, a layered structure forming step is performed to sequentially form an anode layer 520, an emissive layer 550 and a cathode layer 570 on the upper surface 511 of the substrate 510, so as to obtain the organic light-emitting diode 500. In the layered structure forming step, it can choose to arrange the hole transport layer 540 and the electron transport layer 560, and the details are described above and will not be given herein.

Please refer to FIG. 6. FIG. 6 is a structural schematic view of one another organic light-emitting diode 600 manufactured by the manufacturing method of the organic light-emitting diode 400 of FIG. 4. The organic light-emitting diode 600 also includes a substrate 610, an anode layer 620, a scattering layer 630, a hole transport layer 640, an emissive layer 650, an electron transport layer 660 and a cathode layer 670. The arrangement and the forming processes of the abovementioned layers are similar to the organic light-emitting diode 500. The difference is that, in the layered structure forming step, a hole injection layer 680 can be formed between the anode layer 620 and the hole transport layer 640 of the organic light-emitting diode 600. The hole injection layer 680 facilitates the holes transporting into the hole transport layer 640 effectively.

The luminescence properties of the organic light-emitting diodes manufactured by different manufacturing method are tested as below. In the following tests, the current-voltage-luminance characterization of each example and comparison was carried out. The emission area of each example and comparison is 0.09 cm$^2$, and the tests are done in an ambient atmosphere without encapsulation.

The organic light-emitting diodes of Example 1 and Comparison 1 are both manufactured by the manufacturing method of FIG. 1, and have the structures as shown in FIG. 2. In detail, in Example 1 and Comparison 1, the materials of the anode layer, the hole transport layer, the emissive layer, the electron transport layer and the cathode layer are indium tin oxide (ITO), PEDOT:PSS, Ir(ppy)$_2$(acac):CBP, TPBi and lithium fluoride/aluminum, respectively. The difference between Example 1 and Comparison 1 is that, Example 1 includes the quasicrystalline material while Comparison 1 does not include the quasicrystalline material.

Figure 8:
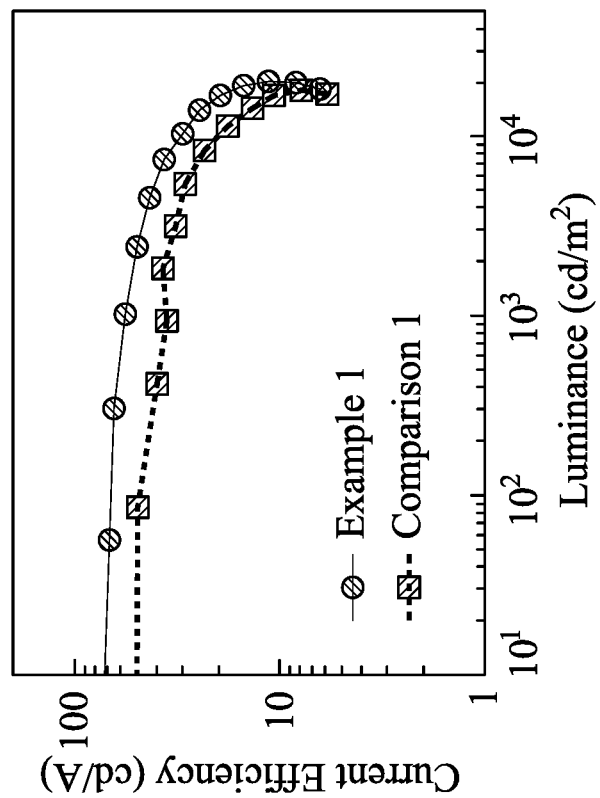
FIG. 8 is a graph showing the relationship between luminance and current efficiency of Example 1 and Comparison 1.
Figure 7:
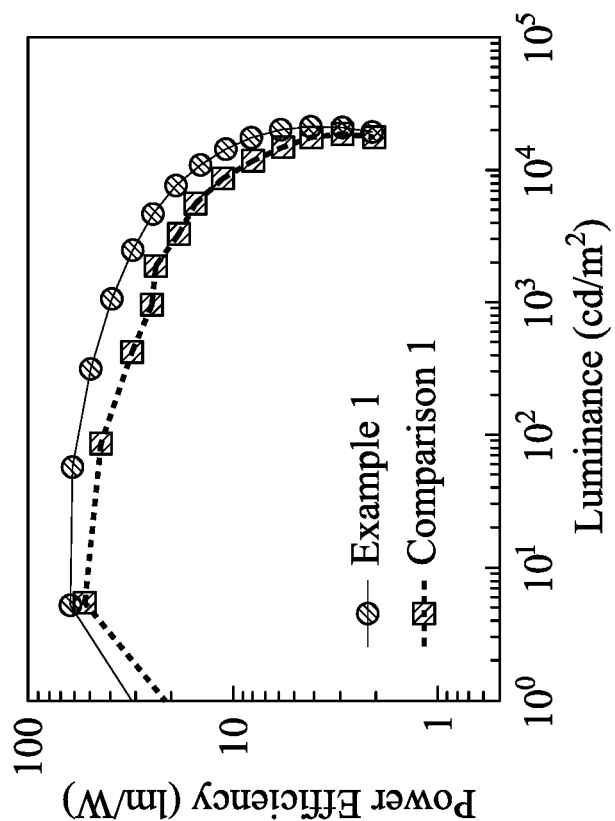
FIG. 7 is a graph showing the relationship between luminance and power efficiency of Example 1 and Comparison 1.
Figure 9:
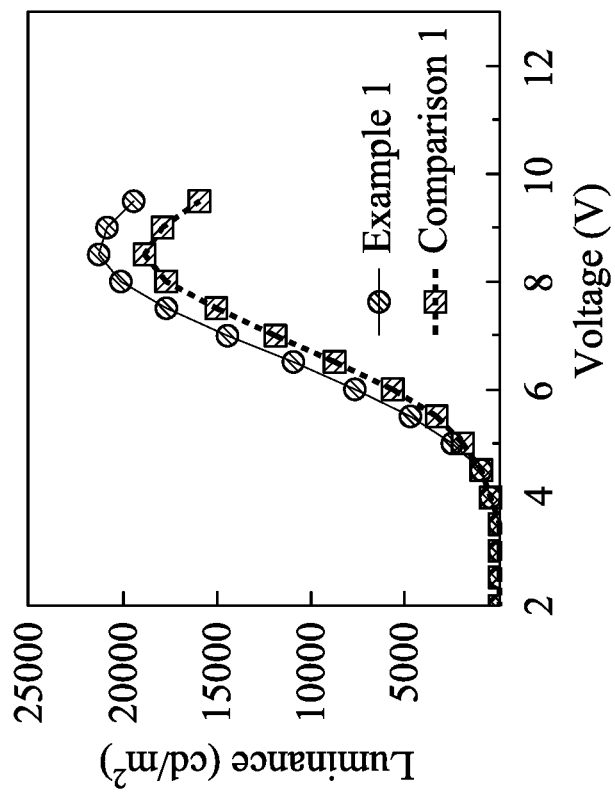
FIG. 9 is a graph showing the relationship between voltage and luminance of Example 1 and Comparison 1.

Please refer to FIG. 7, FIG. 8 and FIG. 9. FIG. 7 is a graph showing the relationship between luminance and power efficiency of Example 1 and Comparison 1. FIG. 8 is a graph showing the relationship between luminance and current efficiency of Example 1 and Comparison 1. FIG. 9 is a graph showing the relationship between voltage and luminance of Example 1 and Comparison 1. From FIG. 7, FIG. 8 and FIG. 9, it can be understood that the power efficiency, current efficiency and external quantum efficiency (EQE) of Example 1 are all enhanced as compared with Comparison 1 under different luminance. Thus, it proves that the organic light-emitting diodes manufactured by the manufacturing method of the present disclosure have better luminescence properties.

Figure 10:
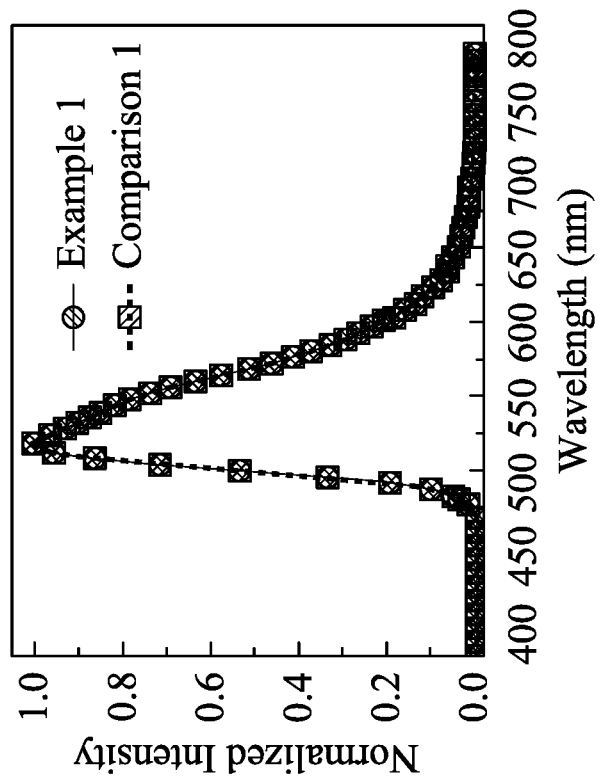
FIG. 10 is a normalized electroluminescent spectra of Example 1 and Comparison 1.

Furthermore, please refer to FIG. 10. FIG. 10 is a normalized electroluminescent spectra of Example 1 and Comparison 1. From FIG. 10, it can be understood that the wavelengths of the lights emitted by Example 1 and Comparison 1 are mostly in the range of green light (495-570 nm), which means the aforementioned organic light-emitting diodes are both light sources which almost completely emit green lights.

The organic light-emitting diodes of Example 2 and Comparison 2 are both manufactured by the manufacturing method of FIG. 4, and have the structures as shown in FIG. 5. In detail, in Example 2 and Comparison 2, the materials of the anode layer, the hole transport layer, the emissive layer, the electron transport layer and the cathode layer are indium tin oxide (ITO), PEDOT:PSS, Ir(ppy)$_2$(acac):CBP, TPBi and lithium fluoride/aluminum, respectively. The difference between Example 2 and Comparison 2 is that, Example 2 includes the quasicrystalline material while Comparison 2 does not include the quasicrystalline material.

Figure 11:
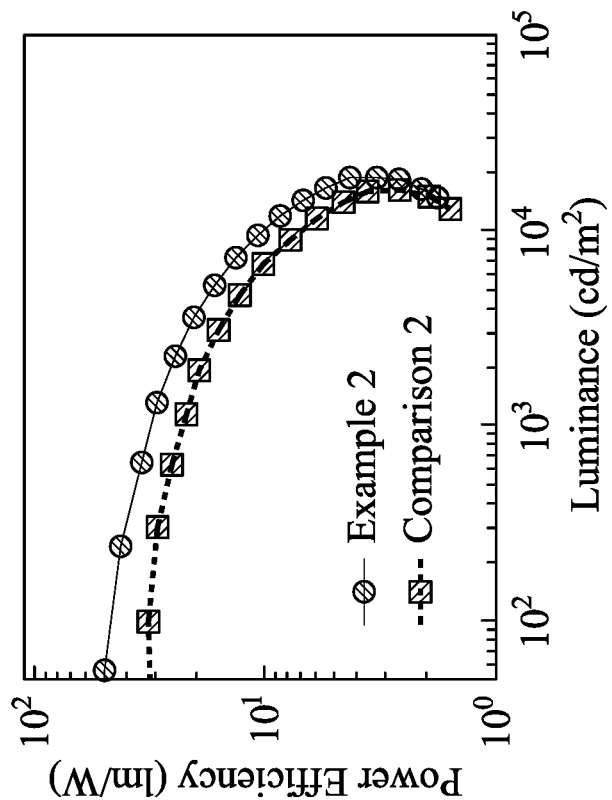
FIG. 11 is a graph showing the relationship between luminance and power efficiency of Example 2 and Comparison 2.
Figure 12:
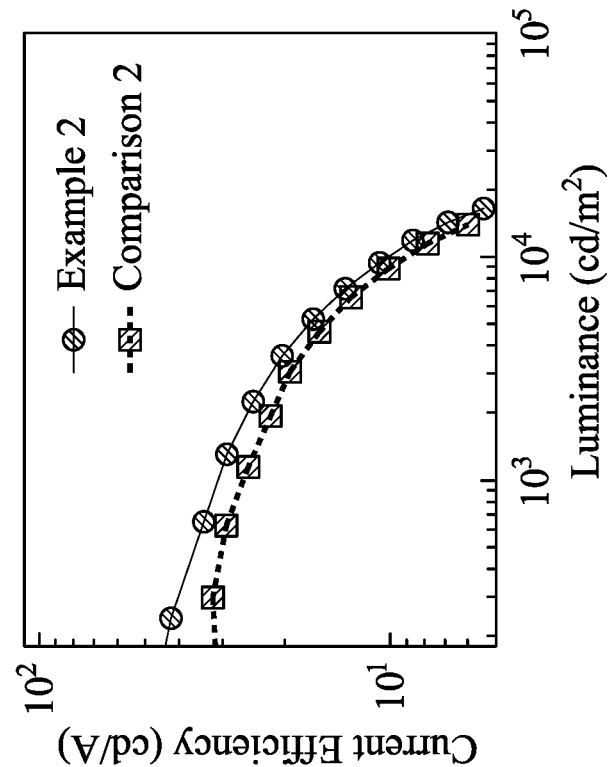
FIG. 12 is a graph showing the relationship between luminance and current efficiency of Example 2 and Comparison 2.
Figure 13:
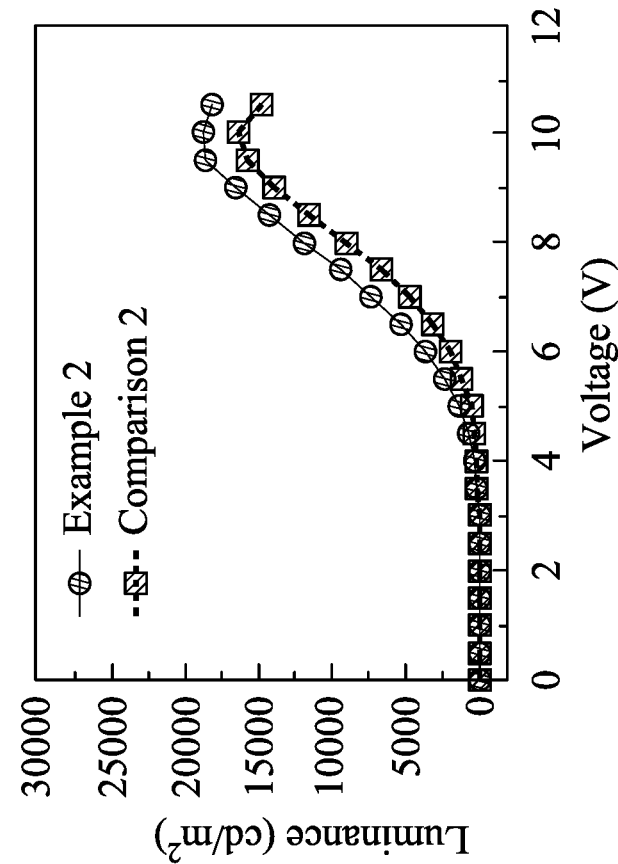
FIG. 13 is a graph showing the relationship between voltage and luminance of Example 2 and Comparison 2.

Please refer to FIG. 11, FIG. 12 and FIG. 13. FIG. 11 is a graph showing the relationship between luminance and power efficiency of Example 2 and Comparison 2. FIG. 12 is a graph showing the relationship between luminance and current efficiency of Example 2 and Comparison 2. FIG. 13 is a graph showing the relationship between voltage and luminance of Example 2 and Comparison 2. Moreover, the power efficiency, the current efficiency, the external quantum efficiency under different operation voltages and luminance and the maximum luminance of Example 2 and Comparison 2 are listed in Table 1 below.

TABLE 1

Luminescence Properties of Example 2 and Comparison 2

|  |  | Example 2 | Comparison 2 | Increased Ratio (%) |
|---|---|---|---|---|
| Operation Voltage (V) |  | 3.2 | 3.0 | — |
| Power Efficiency (lm/W) | Luminance of 10$^2$ cd/m$^2$ | 47.9 | 32.1 | 49 |
|  | Luminance of 10$^3$ cd/m$^2$ | 31.4 | 22.9 | 37 |
|  | Luminance of 10$^4$ cd/m$^2$ | 10.2 | 7.1 | 44 |
| Current Efficiency (cd/A) | Luminance of 10$^2$ cd/m$^2$ | 47.0 | 30.5 | 50.1 |
|  | Luminance of 10$^3$ cd/m$^2$ | 31.1 | 26.4 | 17.6 |
|  | Luminance of 10$^4$ cd/m$^2$ | 10.1 | 8.98 | 13 |
| External Quantum Efficiency (%) | Luminance of 10$^2$ cd/m$^2$ | 15.2 | 11.0 | 38 |
|  | Luminance of 10$^3$ cd/m$^2$ | 13.1 | 10.0 | 31 |
|  | Luminance of 10$^4$ cd/m$^2$ | 6.9 | 4.9 | 41 |
| Maximum Luminance (cd/m$^2$) |  | 18800 | 16430 | — |

From FIG. 11, FIG. 12, FIG. 13 and Table 1 above, it can be understood that the power efficiency, current efficiency and external quantum efficiency of Example 2 are all enhanced as compared with Comparison 2 under different luminance, and the maximum luminance also increases from 16430 cd/m$^2$ to 18800 cd/m$^2$. Thus, it proves that the organic light-emitting diodes manufactured by the manufacturing method of the present disclosure have relatively great luminescence properties.

The organic light-emitting diodes of Example 3 and Comparison 3 are both manufactured by the manufacturing method of FIG. 4, and have the structures as shown in FIG. 6. In detail, in Example 3 and Comparison 3, the materials of the anode layer, the hole injection layer, the hole transport layer, the emissive layer, the electron transport layer and the cathode layer are indium tin oxide (ITO), HAT-CN, TAPC, CBP, TPBi and lithium fluoride/aluminum, respectively. The difference between Example 3 and Comparison 3 is that, Example 3 includes the quasicrystalline material while Comparison 3 does not include the quasicrystalline material.

Figure 14:
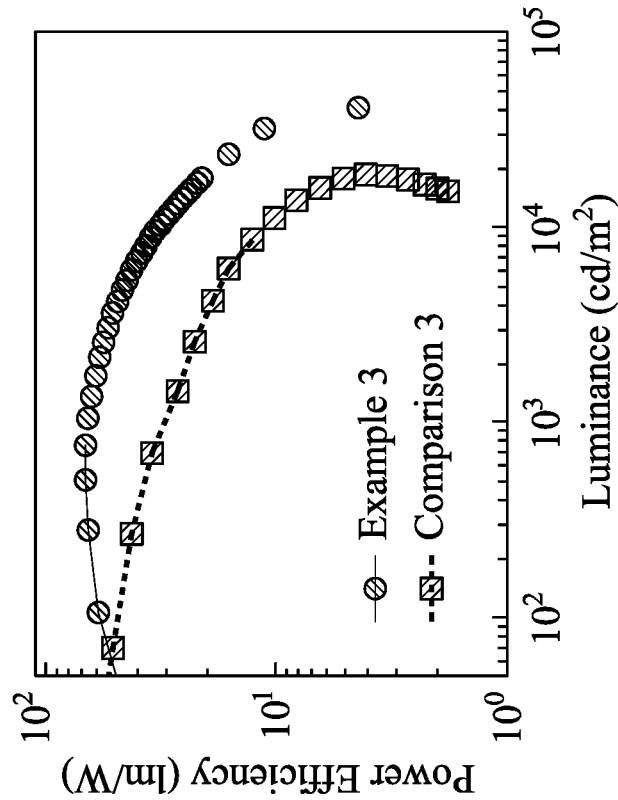
FIG. 14 is a graph showing the relationship between luminance and power efficiency of Example 3 and Comparison 3.
Figures 15, 16:
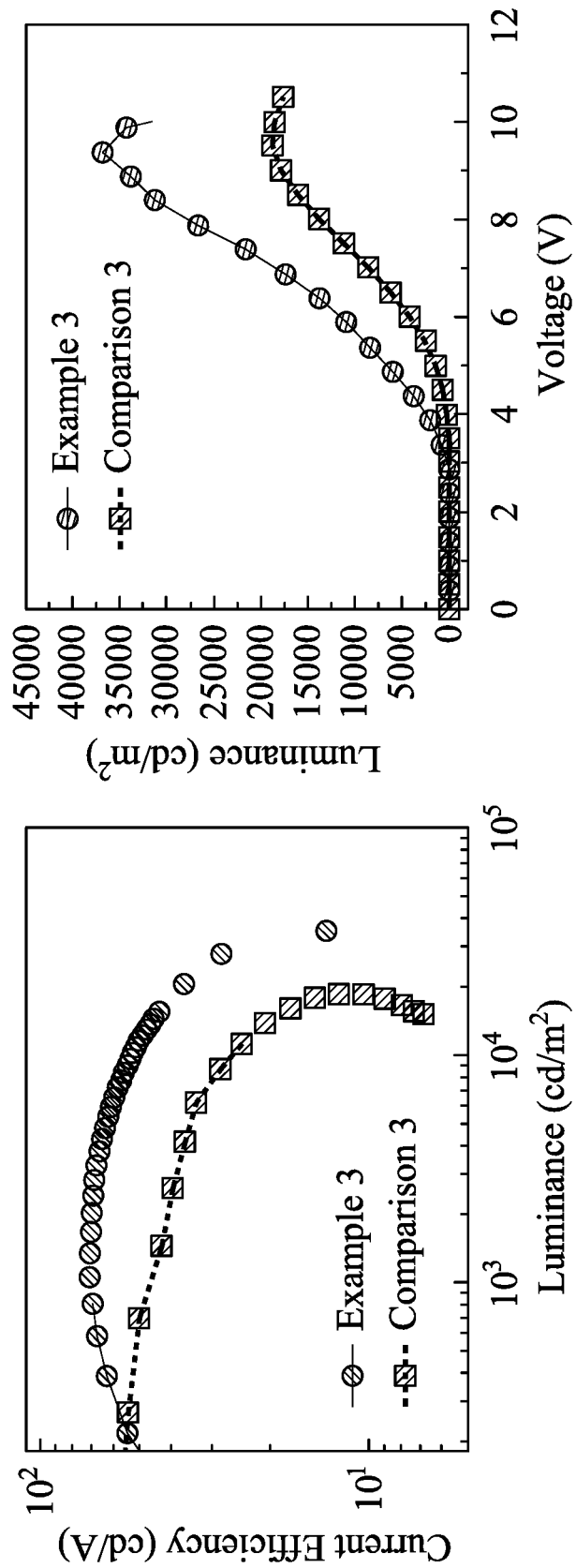
FIG. 15 is a graph showing the relationship between luminance and current efficiency of Example 3 and Comparison 3.
FIG. 16 is a graph showing the relationship between voltage and luminance of Example 3 and Comparison 3.

Please refer to FIG. 14, FIG. 15 and FIG. 16. FIG. 14 is a graph showing the relationship between luminance and power efficiency of Example 3 and Comparison 3. FIG. 15 is a graph showing the relationship between luminance and current efficiency of Example 3 and Comparison 3. FIG. 16 is a graph showing the relationship between voltage and luminance of Example 3 and Comparison 3. Moreover, the power efficiency, the current efficiency, the external quantum efficiency under different operation voltages and luminance and the maximum luminance of Example 3 and Comparison 3 are listed in Table 2 below.

TABLE 2

Luminescence Properties of Example 3 and Comparison 3

|  |  | Example 3 | Comparison 3 | Increased Ratio (%) |
|---|---|---|---|---|
| Operation Voltage (V) |  | 2.8 | 3.0 | — |
| Power Efficiency (lm/W) | Luminance of 10$^2$ cd/m$^2$ | 58.3 | 50.1 | 16 |
|  | Luminance of 10$^3$ cd/m$^2$ | 66.4 | 31.8 | 108 |
|  | Luminance of 10$^4$ cd/m$^2$ | 32.5 | 11.4 | 41 |
| Current Efficiency (cd/A) | Luminance of 10$^2$ cd/m$^2$ | 53.2 | 56.8 | — |
|  | Luminance of 10$^3$ cd/m$^2$ | 70.8 | 47.3 | 50 |
|  | Luminance of 10$^4$ cd/m$^2$ | 55.0 | 26.4 | 108 |
| External Quantum Efficiency (%) | Luminance of 10$^2$ cd/m$^2$ | 14.6 | 15.4 | — |
|  | Luminance of 10$^3$ cd/m$^2$ | 19.5 | 12.0 | 63 |
|  | Luminance of 10$^4$ cd/m$^2$ | 15.2 | 7.1 | 114 |
| Maximum Luminance (cd/m$^2$) |  | 37000 | 18740 | — |

From FIG. 14, FIG. 15, FIG. 16 and Table 2 above, it can be understood that, in general, the power efficiency, current efficiency and external quantum efficiency of Example 3 under different luminance are relatively great. Especially, the current efficiency and external quantum efficiency are respectively enhanced by 180% and 114% under high luminance (10$^4$ cd/m$^2$). Also, the maximum luminance of Example 3 also significantly increases to 37000 cd/m$^2$. Thus, it proves that the organic light-emitting diodes manufactured by the manufacturing method of the present disclosure have relatively great luminescence properties.

Figure 17:
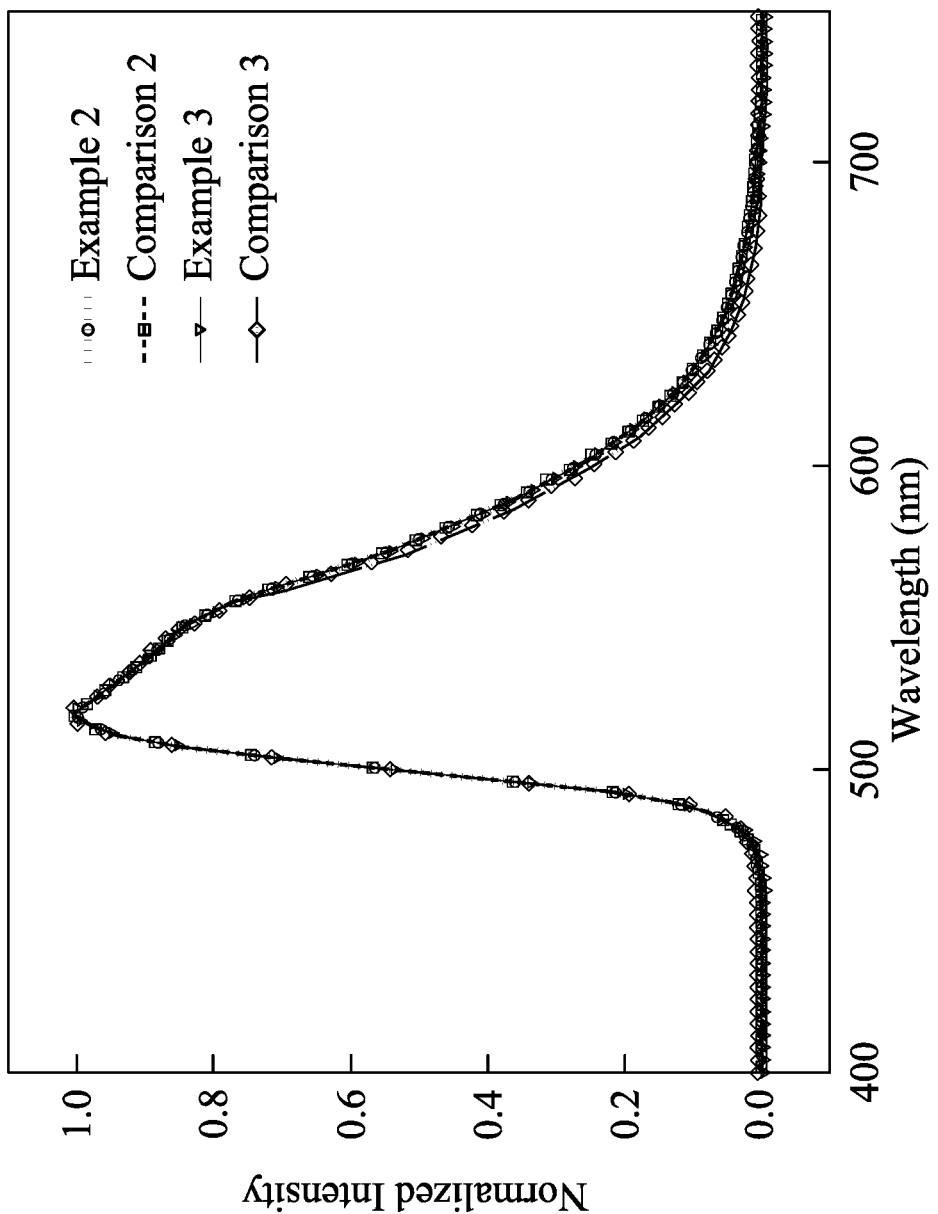
FIG. 17 is a normalized electroluminescent spectra of Example 2, Example 3, Comparison 2 and Comparison 3.

Furthermore, please refer to FIG. 17. FIG. 17 is a normalized electroluminescent spectra of Example 2, Example 3, Comparison 2 and Comparison 3. From FIG. 17, it can be understood that the wavelengths of the lights emitted by Example 2, Example 3, Comparison 2 and Comparison 3 are mostly in the range of green light (495-570 nm), which means the aforementioned organic light-emitting diodes are all light sources which almost completely emit green lights.

In this regard, according to the manufacturing method of the organic light-emitting diode of the present disclosure, the material of the scattering layer is chosen to be the quasicrystalline material. Therefore, the luminous efficiency and luminance of the organic light-emitting diode are enhanced. The complexity of forming the scattering layer is also reduced, which facilitates the large-scale production.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A manufacturing method of an organic light-emitting diode, comprising:
providing a substrate; and
performing a layered structure forming step to sequentially form an anode layer, a scattering layer, an emissive layer and a cathode layer on the substrate, so as to obtain an organic light-emitting diode;
wherein a material of the scattering layer is an aluminum-cobalt-copper nano-quasicrystal.

2. The manufacturing method of the organic light-emitting diode of claim 1, wherein the aluminum-cobalt-copper nano-quasicrystal is manufactured by a synthesis method, the synthesis method comprises:
providing a raw material comprising an aluminum metal, a cobalt metal and a copper metal;
performing an annealing step to anneal the raw material after the raw material is melted, so as to obtain an aluminum-cobalt-copper quasicrystal; and
performing an exfoliating step, wherein the aluminum-cobalt-copper quasicrystal is mixed with a solvent to form a quasicrystalline solution, and the quasicrystalline solution is sonicated, so as to make the aluminum-cobalt-copper quasicrystal exfoliate into the aluminum-cobalt-copper nano-quasicrystal.

3. The manufacturing method of the organic light-emitting diode of claim 2, wherein in the annealing step, the raw material, which is melted, is annealed under 900° C. in the vacuum for 15 days.

4. The manufacturing method of the organic light-emitting diode of claim 2, wherein the solvent is an N,N-dimethylformamide solvent, and in the exfoliating step, the quasicrystalline solution is sonicated for 60 hours.

5. The manufacturing method of the organic light-emitting diode of claim 1, wherein the scattering layer is spin-coated on the anode layer.

6. The manufacturing method of the organic light-emitting diode of claim 1, wherein a hole transport layer is formed between the scattering layer and the emissive layer in the layered structure forming step.

7. The manufacturing method of the organic light-emitting diode of claim 1, wherein an electron transport layer is formed between the emissive layer and the cathode layer in the layered structure forming step.

8. An organic light-emitting diode, wherein the organic light-emitting diode is manufactured by the manufacturing method of the organic light-emitting diode of claim 1.

9. A manufacturing method of an organic light-emitting diode, comprising:
providing a substrate, wherein the substrate comprises an upper surface and a bottom surface opposite to the upper surface;
performing a scattering layer forming step to form a scattering layer on the bottom surface of the substrate; and
performing a layered structure forming step to sequentially form an anode layer, an emissive layer and a cathode layer on the upper surface of the substrate, so as to obtain an organic light-emitting diode;
wherein a material of the scattering layer is an aluminum-cobalt-copper nano-quasicrystal.

10. The manufacturing method of the organic light-emitting diode of claim 9, wherein the aluminum-cobalt-copper nano-quasicrystal is manufactured by a synthesis method, the synthesis method comprises:
providing a raw material comprising an aluminum metal, a cobalt metal and a copper metal;
performing an annealing step to anneal the raw material after the raw material is melted, so as to obtain an aluminum-cobalt-copper quasicrystal; and
performing an exfoliating step, wherein the aluminum-cobalt-copper quasicrystal is mixed with a solvent to form a quasicrystalline solution, and the quasicrystalline solution is sonicated, so as to make the aluminum-cobalt-copper quasicrystal exfoliate into the aluminum-cobalt-copper nano-quasicrystal.

11. The manufacturing method of the organic light-emitting diode of claim 10, wherein in the annealing step, the raw material, which is melted, is annealed under 900° C. in the vacuum for 15 days.

12. The manufacturing method of the organic light-emitting diode of claim 10, wherein the solvent is an N,N-dimethylformamide solvent, and in the exfoliating step, the quasicrystalline solution is sonicated for 60 hours.

13. The manufacturing method of the organic light-emitting diode of claim 9, wherein the scattering layer is drop-cast on the bottom surface of the substrate.

14. The manufacturing method of the organic light-emitting diode of claim 9, wherein a hole transport layer is formed between the anode layer and the emissive layer in the layered structure forming step.

15. The manufacturing method of the organic light-emitting diode of claim 14, wherein a hole injection layer is formed between the anode layer and the hole transport layer in the layered structure forming step.

16. The manufacturing method of the organic light-emitting diode of claim 9, wherein an electron transport layer is formed between the emissive layer and the cathode layer in the layered structure forming step.

17. An organic light-emitting diode, wherein the organic light-emitting diode is manufactured by the manufacturing method of the organic light-emitting diode of claim 9.

* * * * *